(12) United States Patent
Lotfy et al.

(10) Patent No.: US 10,707,878 B2
(45) Date of Patent: Jul. 7, 2020

(54) APPARATUS AND SYSTEM FOR DIGITALLY CONTROLLED OSCILLATOR

(71) Applicant: Intel Corporation, Santa Clara, CA (US)

(72) Inventors: Amr M. Lotfy, Alexandria (EG); Mohamed A. Abdelsalam, Giza (EG); Mohammed W. El Mahalawy, Ames, IA (US); Nasser A. Kurd, Portland, OR (US); Mohamed A. Abdelmoneum, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/831,694

(22) Filed: Aug. 20, 2015

(65) Prior Publication Data
US 2016/0006443 A1    Jan. 7, 2016

Related U.S. Application Data

(63) Continuation of application No. 13/995,895, filed as application No. PCT/US2012/030151 on Mar. 22, 2012, now Pat. No. 9,257,994.

(51) Int. Cl.
*H03L 7/00*        (2006.01)
*H03L 7/081*       (2006.01)
(Continued)

(52) U.S. Cl.
CPC ............ *H03L 7/00* (2013.01); *H03K 3/0315* (2013.01); *H03L 7/087* (2013.01); *H03L 7/0818* (2013.01); *H03L 7/0992* (2013.01)

(58) Field of Classification Search
CPC .............................. H03L 7/0992; H03L 7/087
(Continued)

(56) References Cited

U.S. PATENT DOCUMENTS 6,084,483 A * 7/2000 Keshtbod ............. H03K 3/0315
                                                         331/176
8,258,880 B2 * 9/2012 Koh ....................... H03K 3/011
                                                        331/176
(Continued)

FOREIGN PATENT DOCUMENTS

WO     2013141863 A1    9/2013

OTHER PUBLICATIONS

Non-Final Office Action for U.S. Appl. No. 13/995,895, dated Oct. 20, 2014.
(Continued)

*Primary Examiner* — Jeffrey M Shin
(74) *Attorney, Agent, or Firm* — Green, Howard & Mughal LLP

(57) ABSTRACT

Described herein is apparatus and system for a digitally controlled oscillator (DCO). The apparatus comprises a voltage regulator to provide an adjustable power supply; and a DCO to generate an output clock signal, the DCO including one or more delay elements, each delay element operable to change its propagation delay via the adjustable power supply, wherein each delay element comprising an inverter with adjustable drive strength, wherein the inverter is powered by the adjustable power supply. The apparatus further comprises a digital controller to generate a first signal for instructing the voltage regulator to adjust a voltage level of the adjustable power supply.

19 Claims, 10 Drawing Sheets

(51) Int. Cl.
*H03L 7/087* (2006.01)
*H03K 3/03* (2006.01)
*H03L 7/099* (2006.01)

(58) Field of Classification Search
USPC .............................. 331/1 A, 34, 57, 185, 186
See application file for complete search history.

(56) References Cited

U.S. PATENT DOCUMENTS

| | | |
|---|---|---|
| 8,427,219 B1 | 4/2013 | Wu et al. |
| 2004/0130357 A1 | 7/2004 | Smith |
| 2008/0048788 A1 | 2/2008 | Yu |
| 2010/0090771 A1 | 4/2010 | Shin |
| 2010/0135368 A1 | 6/2010 | Mehta et al. |
| 2010/0253298 A1 | 10/2010 | Nonis et al. |
| 2011/0210798 A1 | 9/2011 | Koh et al. |
| 2012/0223778 A1 | 9/2012 | Shin et al. |
| 2012/0223781 A1 | 9/2012 | Chen et al. |
| 2013/0076450 A1* | 3/2013 | Rao ..................... H03L 7/0896 331/34 |
| 2013/0249611 A1* | 9/2013 | Vandepas ................ H03L 1/022 327/159 |

OTHER PUBLICATIONS

Final Office Action for U.S. Appl. No. 13/995,895, dated Mar. 24, 2015.
Notice of Allowance for U.S. Appl. No. 13/995,895, dated Jun. 11, 2015.
International Preliminary Report on Patentability for PCT Application No. PCT/US12/30151, dated Oct. 2, 2014.
International Search Report & Written Opinion for PCT Application No. PCT/US12/30151, dated Nov. 30, 2012.

* cited by examiner

US 10,707,878 B2

APPARATUS AND SYSTEM FOR DIGITALLY CONTROLLED OSCILLATOR

CLAIM OF PRIORITY

This application is a continuation of U.S. patent application Ser. No. 13/995,895, filed on 19 Jun. 2013, titled "APPARATUS AND SYSTEM FOR DIGITALLY CONTROLLED OSCILLATOR," issued as U.S. Pat. No. 9,257,994, on Feb. 9, 2016, which is a National Stage application and claims the benefit of priority of International Patent Application No. PCT/US2012/030151 filed Mar. 22, 2012, titled "APPARATUS AND SYSTEM FOR DIGITALLY CONTROLLED OSCILLATOR," both of which are incorporated by reference in their entirety.

BACKGROUND

Analog phase locked loops (PLLs) do not scale well across process technologies. The term "scale" herein refers to converting or translating a circuit design manufactured and optimized to operate in a process manufacturing technology to another advanced process manufacturing technology with smaller dimensions and different transistor behavior. For example, a PLL design scaled from a 45 nm Complementary metal-oxide-semiconductor (CMOS) process manufacturing technology to a 32 nm CMOS process manufacturing technology requires a complete re-design of operation points for the analog circuits of the PLL. Such scaling of circuit design adds to the overall cost of the design because more time is spent re-designing the circuit when the circuit is ported or scaled from one process technology to a more advanced process technology.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
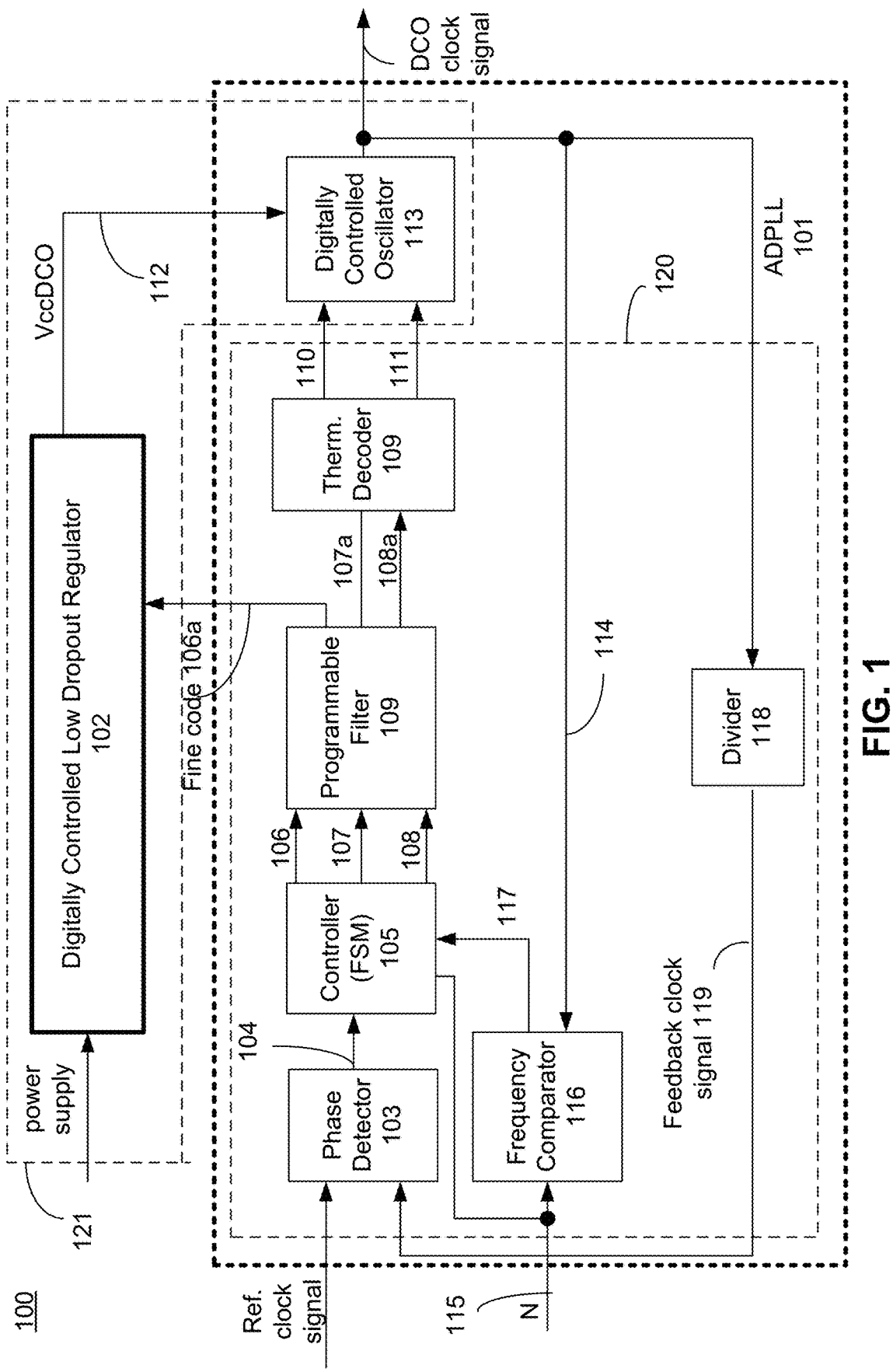
FIG. 1 is a high level architecture of the all digital phase locked loop (ADPLL) coupled to a digitally controlled regulator, according to one embodiment of the disclosure.

Scaling a circuit design adds to overall cost of the design because more time is spent re-designing the circuit when the circuit is ported or scaled from one process technology to a more advanced process technology. The embodiments herein relate to apparatus, method, and system for programmable all digital phase locked loop (ADPLL) which is scalable across different process manufacturing technologies.

In one embodiment, the apparatus comprises a voltage regulator to provide an adjustable power supply; and a digitally controlled oscillator (DCO) to generate an output clock signal, the DCO including one or more delay elements, each delay element operable to change its propagation delay via the adjustable power supply. In one embodiment, each delay element comprises an inverter with adjustable drive strength, wherein the inverter is powered by the adjustable power supply.

In one embodiment, the apparatus further comprises a state machine (also referred to as a controller or digital controller) to generate at least two signals for varying the propagation delay of the one or more delay elements in the DCO. In one embodiment, the two signals include a first signal (also called fine code) to cause the voltage regulator (also called low dropout regulator) to provide the adjustable power supply. In one embodiment, the two signals include a second signal (also called the coarse code) to provide an initial delay setting for the one or more delay elements. In one embodiment, the state machine is operable to generate a third signal (also called the ultra-fine code) to provide propagation delay setting for the one or more delay elements after the first signal causes the voltage regulator to provide the adjustable power supply to the DCO.

In one embodiment, the system comprises a wireless interface; and a processor operable to communicate with other devices via the wireless interface, the processor including the ADPLL as described herein.

The technical effects of the embodiments discussed herein are many. For example, the embodiments herein provide an ADPLL that has a wide frequency range achieved by combining a least three tuning knobs by adjusting drive strength of the inverter in the DCO cells and by adjusting power supply levels to the transistors of the DCO cell. The three knobs also provide frequency adjustment with higher resolution than traditional digital PLLs thus resulting in better jitter performance compared to traditional digital PLLs.

In the embodiments discussed herein, the ADPLL results in a scalable design thus reducing overall design and verification costs associated with designing the ADPLL and verifying its operation. The ADPLL discussed herein also includes a programmable filter to control bandwidth, stability, and lock time of the ADPLL. In the embodiments discussed herein, a lookup table is also provided to store a code word that is used for fast locking of the ADPLL when the ADPLL wakes up from reset or any low power state (e.g., sleep mode). The above technical effects are not limiting in any way. Other technical effects are contemplated by the embodiments discussed herein.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 is a high level architecture 100 of an ADPLL 101 coupled to a digitally controlled regulator 110, according to one embodiment of the disclosure. In one embodiment, the ADPLL 101 comprises a phase detector 103 which receives a reference clock signal and a feedback clock signal 119 (divided version of the DCO clock signal). In one embodiment, the phase detector 103 compares the phase of the reference clock signal and the feedback clock signal 119 to generate an output signal 104 indicating whether the phase of the feedback signal 119 is ahead or behind (in time domain) relative to the phase of the reference clock signal. Any well known phase detector can be used for the ADPLL 101 discussed herein.

In one embodiment, the output 104 of the phase detector 103 is received by a controller 105. In one embodiment, the controller 105 generates at least three digital code word signals (106, 107, and 108) in response to a reset signal, the output 104 of the phase detector, and an output of a frequency comparator 116. These digital code word signals (106, 107, and 108) are used to sequentially adjust the delay setting of each delay element/cell of the DCO 113 to lock the ADPLL 101.

In one embodiment, the controller 105 stores the three digital code words (106, 107, and 108) in a lookup table (not shown) after the ADPLL 101 is locked. In such an embodiment, the stored digital code words are fetched by the controller 105 for faster re-locking of the ADPLL 101 after the ADPLL 101 is reset or after the ADPLL 101 is powered-up again following an initial lock. In one embodiment, the lookup table comprises a non-volatile memory (NVM). In one embodiment, the NVM is at least one of a NOR or NAND NVM. In other embodiments, other types of NVMs may be used to form the lookup table.

In one embodiment, the first signal 108 is a code word representing a coarse code for setting an initial delay configuration of the delay elements in the DCO 113. The term "first signal 108" is interchangeably used to refer to "coarse code 108." The term "coarse" herein indicates a relative larger change in DCO cell propagation delay compared to delay change in the DCO cell propagation delay caused by other codes i.e., fine and ultra-fine.

In one embodiment, the coarse code 108 is 6 bits wide, each bit controlling drive strength of an inverter of a delay cell in the DCO 113. In other embodiments the coarse code 108 may have fewer or more bits to control the initial delay setting of the DCO 113.

In one embodiment, the second signal 106 is a code word representing a fine code for adjusting the power supply level to each delay element in the DCO 113. The term "second signal 106" is interchangeably used to refer to "fine code 106." The term "fine" herein indicates a relative smaller change in DCO cell propagation delay compared to delay change in the DCO cell propagation delay caused by coarse code.

In one embodiment, the fine code 106 is 6 bits wide, each bit controlling drive strength of an inverter of a delay cell in the DCO 113 by adjusting power supply to the inverter and other transistors coupled to the inverter. In other embodiments the fine code 106 may have fewer or more bits to control the initial delay setting of the DCO 113. In one embodiment, the fine code 106 is filtered and then received by a digitally controlled low dropout regulator (LDO) 102 which outputs a regulated power supply VccDCO 112 for the DCO 113 according to the filtered version 106a of the fine code 106. In one embodiment, the fine code 106 is generated after the coarse code 108 is determined by the controller 105.

In one embodiment, the third signal 107 is code word representing an ultra-fine code for setting a final delay configuration of the delay elements in the DCO 113. The term "third signal 107" is interchangeably used to refer to "ultra-fine code 107." The term "ultra-fine" herein indicates a relative smallest change in DCO cell propagation delay compared to delay change in the DCO cell propagation delay caused by other codes i.e., coarse and fine.

In one embodiment, the ultra-fine code 107 is 7 bits wide, each bit controlling drive strength of an inverter of a delay cell in the DCO 113. In other embodiments the ultra-fine code 107 may have fewer or more bits to control the final delay setting of the DCO 113. In one embodiment, the ultra-fine code 107 is determined after the controller 105 determines the fine code 106.

Figure 5:
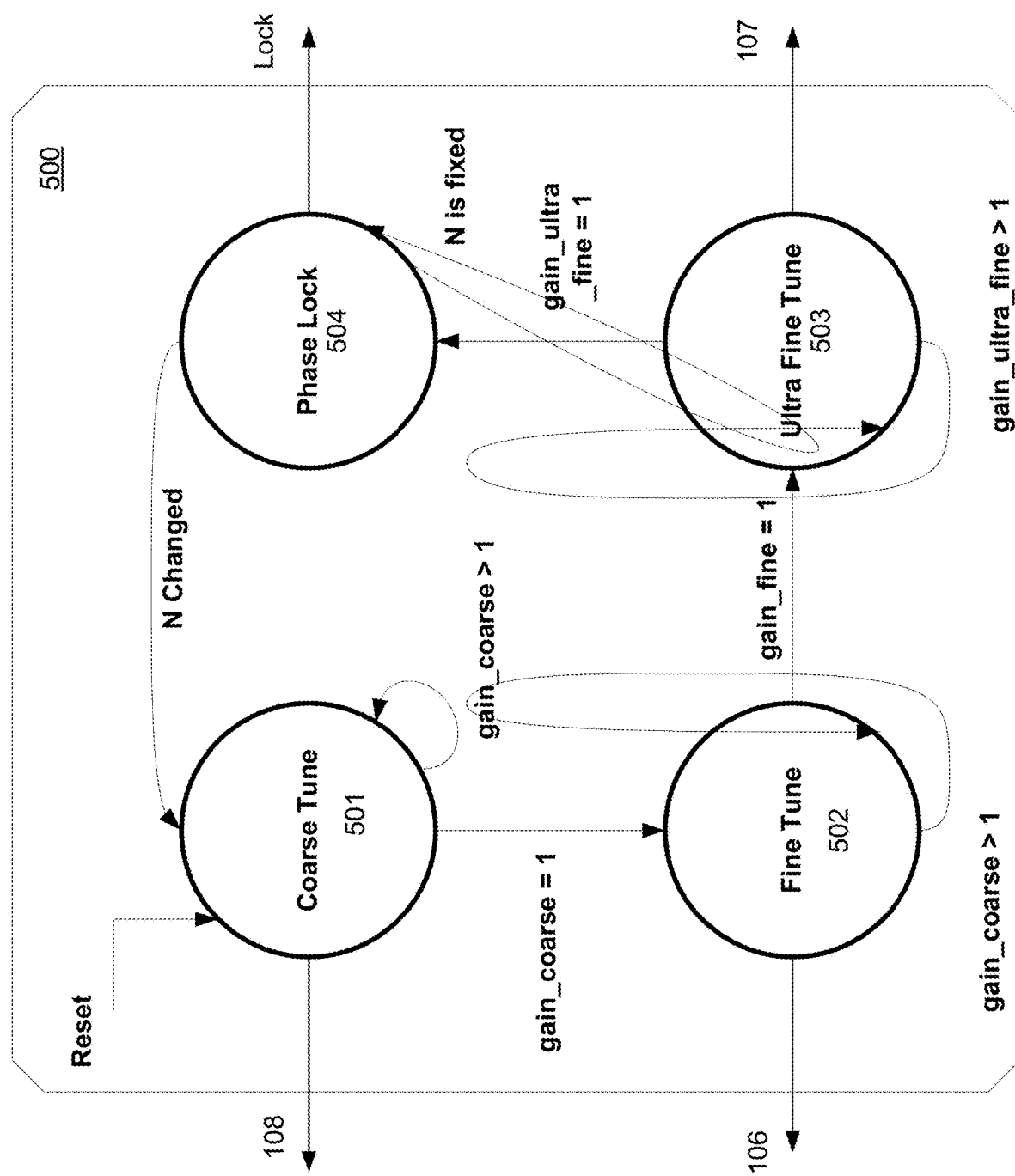
FIG. 5 is a state diagram of a controller of the ADPLL, according to one embodiment of the disclosure.

FIG. 5 is a state diagram 500 of the controller 105 of the ADPLL 101, according to one embodiment of the disclosure. The state diagram 500 may be implemented with sequential logic units according to any known method of converting a state diagram of a finite state machine (FSM) to hardware logic units.

In one embodiment, upon reset (e.g., the reset signal for the processor having the ADPLL 101), the controller 105 begins to determine the coarse code 108 for the DCO 113.

In one embodiment, determining the coarse code 108 is the first state of the state machine and is also referred to as coarse tuning of the ADPLL 101. In one embodiment, the controller 105 monitors the output 117 of the frequency comparator 116 to determine whether to increase or decrease the value of the coarse code 108.

For example, the code value of the coarse code 108 is increased by one during the first state if the signal 117 indicates that the controller 105 should increase the oscillating frequency of the DCO 113. In one embodiment, the code value of the coarse code 108 is decreased by one if the signal 117 indicates that the controller 105 should decrease the oscillating frequency of the DCO 113. In other embodiments, the code value of the coarse code 108 is adjusted (increased or decreased) using a binary search algorithm in response to the indication from signal 117.

In one embodiment, the coarse code 108 begins with an initial value which is pre-determined from simulations so that the DCO 113 provides an oscillating frequency (of the DCO clock signal) to be within 10% of the desired DCO oscillating frequency. In other embodiments, the coarse code 108 begins from zero.

In one embodiment, the controller 105 monitors the loop gain of the ADPLL 101 and compares with it '1.'

The term "loop gain" herein refers to $f(N^*K_{DCO})$, where 'N' is a number of steps that control the oscillating frequency of the DCO 113, and where $K_{DCO}$ is the minimum frequency step of the DCO 113. The loop gain is a function of the minimum frequency step of the DCO 113 multiplied by the number of steps determined by the controller 105 according to the phase error 104.

In one embodiment, the controller 105 continues to update the coarse code 108 as long as the loop gain of the ADPLL 101 is greater than '1.' In such an embodiment, the controller 105 saves the coarse code 108 once the loop gain of the ADPLL 101 is equal to '1.'

In one embodiment, when the loop gain of the ADPLL 101 is equal to '1' or when the DCO 113 achieves an oscillating frequency which is substantially close to the target oscillating frequency of the DCO 113, then the state machine 500 proceeds to the second state 502—fine tuning state. The term "substantially" herein refers to being within 10% of the target.

In one embodiment, during the fine tuning state 502, the fine code 106 is determined to correct the frequency and phase error of the ADPLL 101 to bring the oscillating frequency of the DCO 113 more closer to its target oscillating frequency i.e., closer than what the coarse code 108 achieved. In one embodiment, LDO 102 receives an unregulated power supply and generates a regulated VccDCO 112 with power level adjustable by the fine code 106a (which is a filtered version of the fine code 106 generated by the state machine 500).

In one embodiment, the state machine 500 begins the fine code 106 with an initial value which is pre-determined from simulations so that the DCO 113 provides an oscillating frequency (of the DCO clock signal) to be within 10% of the desired DCO oscillating frequency. In other embodiments, the state machine 500 begins fine code 106 from zero.

In one embodiment, during the second state 502 a binary search algorithm is executed based on the output 104 of the phase detector 103. In one embodiment the gain of the fine tuning word is reduced to half of its value after every change in the polarity of the output 104. In one embodiment, once the gain of the fine tuning reaches '1,' the fine code 106 is determined.

The term "gain of the fine tuning word" herein refers generally to the change in oscillating frequency of the DCO 113 with reference to changing power supply VccDCO 112 i.e., when the power supply level of VccDCO 112 is adjusted (e.g., by 1 mV), the oscillating frequency of the DCO 113 changes by a minimum frequency step (e.g., 100 MHz). The gain of the fine tuning code word can be described as $f(N^*K_{DCO\_fine})$, where 'N' is a number of steps, and $K_{DCO\_fine}$ is the minimum frequency step due to a change in the power supply level of VccDCO 112.

In one embodiment, when the gain of the fine tuning word is equal to '1' or when the DCO 113 achieves an oscillating frequency which is substantially closer (i.e., closer than what the coarse code 108 achieved) to the target oscillating frequency of the DCO 113, then the state machine 500 proceeds to the third state 503—ultra-fine tuning state.

In one embodiment, during the third state 503 the state machine 500 applies binary search algorithm till the gain of the ultra-fine code word tuning reaches '1.'

The term "gain of the ultra-fine tuning word" herein refers generally to the change in oscillating frequency of the DCO 113 in response to change in the code 107a i.e., changing the controlling code 107a of the DCO 113 changes the oscillating frequency of the DCO 113. The gain of the ultra-fine tuning code word can be described as $f(N^*K_{DCO\_ufine})$, where 'N' is the number of steps, and where $K_{DCO\_ufine}$ is the minimum frequency step due to a change in the controlling code 107a.

In one embodiment, when the gain of the fine tuning word is equal to '1' or when the DCO 113 achieves an oscillating frequency which is the target oscillating frequency of the DCO 113, then the state machine transitions to state 504 (also called lock state) at which the state machine 500 declares that the ADPLL 101 is locked.

The term "lock" herein refers to an operational condition of the ADPLL 101 when the phase of the feedback signal 119 is substantially aligned with the phase of the reference clock signal for a determined time period or number of cycles of the reference clock signal. The term "substantially" herein refers to being within 10% of the target.

In one embodiment, during the lock state 504 the state machine 500 monitors the output 104 of the phase detector 103 to make sure that the ADPLL 101 is indeed in a locked state and is not incorrectly declared locked. In one embodiment, a look-up table (not shown) is implemented to save/store the coarse, fine, and ultra-fine code words (108, 106, and 107) after the ADPLL 101 is declared in lock state 504. In one embodiment, the state machine 500 stores the coarse, fine, and ultra-fine code words (108, 106, and 107) for any particular frequency of the DCO clock signal so that the DCO 113 can be re-configured to operate at that particular frequency by applying the stored/saved coarse, fine, and ultra-fine code words (108, 106, and 107) from the look-up table.

In one embodiment, when the ADPLL 101 wakes from a sleep state or is reset and the look-up table has the stored coarse, fine, and ultra-fine code words (108, 106, and 107), then the ADPLL 101 may use the stored coarse, fine, and ultra-fine code words (108, 106, and 107) as a starting point to re-lock the ADPLL 101. By using the stored coarse, fine, and ultra-fine code words (108, 106, and 107) a faster lock time is achieved for the ADPLL 101 compared to when the ADPLL 101 has to re-determine new coarse, fine, and ultra-fine code words (108, 106, and 107) before it can re-lock. For example, the ADPLL 101 may re-lock by applying the stored coarse, fine, and ultra-fine code words (108, 106, and 107) in 350 ns compared to re-locking at 5 us by re-determining the coarse, fine, and ultra-fine code words (108, 106, and 107) from scratch.

Referring back to FIG. 1, in one embodiment the output of the controller (state machine) 105—signals 106, 107, and 108—are filtered by a programmable filter 109. The programmable filter 109 is also referred to as a programmable digital loop filter (DLF). In one embodiment, the programmable DLF 109 is operable to receive control bits (not shown) to adjust coefficients of the programmable DLF 109. By adjusting the coefficients of the programmable DLF 109, bandwidth of the ADPLL 101 can be adjusted in relation to lock time and stability of the ADPLL 101. Such programmable ability to trade off bandwidth, lock time, and stability allows the ADPLL 101 design to scale over multiple process manufacturing technologies.

Figure 4A:
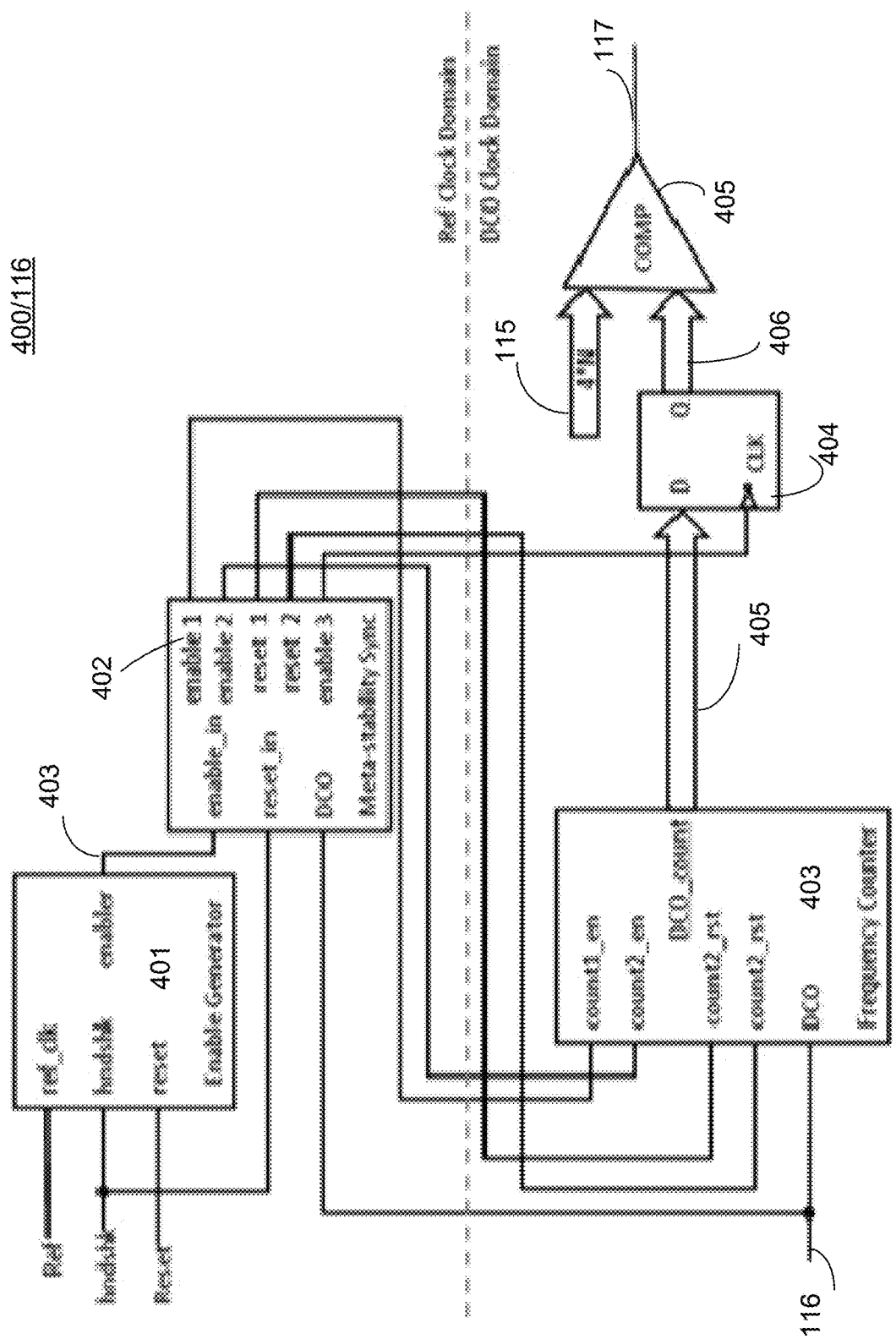
FIG. 4A is a frequency comparator architecture of the ADPLL, according to one embodiment of the disclosure.
Figure 4B:
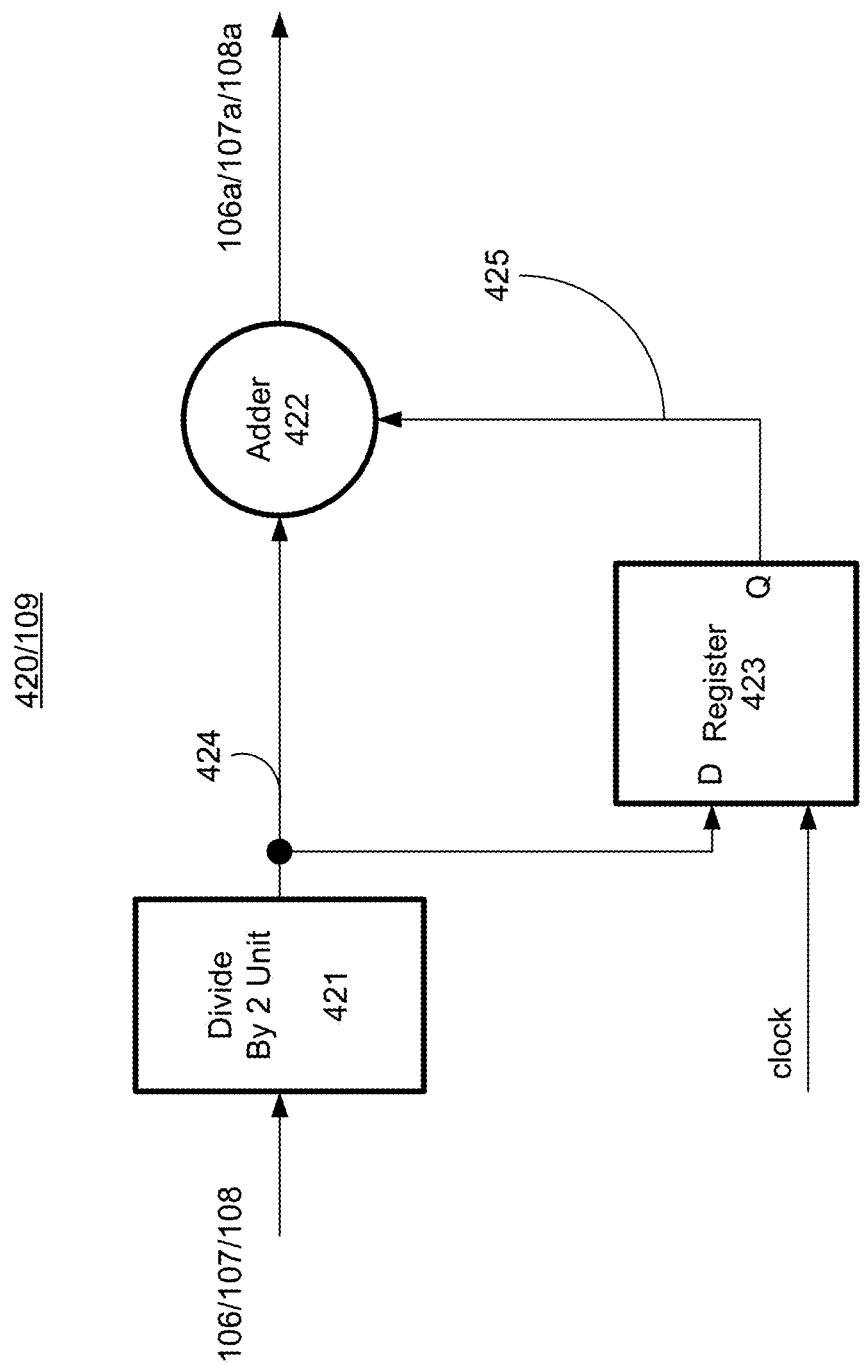
FIG. 4B is a programmable digital loop filter (DLF) of the ADPLL, according to one embodiment of the disclosure.

FIG. 4B is a programmable DLF 420/109 of the ADPLL 101, according to one embodiment of the disclosure. So as not to obscure the embodiment of the programmable DLF 420/109, only a single bit DLF 420/109 is shown to filter one input signal, e.g., 106. Multiple instances of shared logic may be used to filter multiple input signals, i.e. 106, 107, and 108, without changing the scope of the embodiments of the disclosure.

In one embodiment, the programmable DLF 420/109 comprises a divide-by-two logic unit 421 that divides the frequency of the three signals (106, 107, and 108) by two. Any known divide-by-two logic unit may be configured to perform the function of the divide-by-two logic 421. In one embodiment, the output 424 of the divide-by-two logic 421 is then added by an adder 422 with a previous value 425 of the output from the divide-by-two logic 421. In one embodiment, the output of the adder 422 is the filtered signal, i.e. signals 106a, 107a, and 108a.

Referring back to FIG. 1, the outputs 107a (filtered ultra-fine code) and 108a (filtered coarse code) of the filter 109 are converted from binary coded signals 107a and 108a to thermometer coded signals 110 and 111. Any known thermometer encoder may be used herein. In one embodiment, the 6 bit binary coded filtered coarse code 108a is converted to a 56 bit thermometer coded coarse code. In one embodiment, the thermometer coarse code 111 is used to adjust the drive strength of the inverter of each delay cell in the DCO 113. In one embodiment, the 6 bit binary filtered ultra-fine code 107a is converted to a 126 bit thermometer coded ultra fine code 110 for fine adjustment of delay of each delay cell of the DCO 113.

In one embodiment, the output 106a (fine code) of the programmable DLF 109 is received by the LDO 102 for adjusting the power supply VccDCO 112 of the DCO 113. In other embodiment, the LDO 102 receives a thermometer coded fine code 106a from the thermometer encoder 109 for fine adjustment of the power supply VccDCO 112. In one embodiment, the LDO 102 receives an unregulated power supply and generates a regulated VccDCO 112 with power level adjustable by the fine code 106a. In one embodiment, the LDO 102 comprises a DC-DC converter with a pulse-width-modulated (PWM) signal generator coupled to a bridge driver, wherein the bridge driver receives the output from the PWM signal generator and generates an output signal which forms VccDCO 112 after passing through an inductor. In other embodiments, other forms of voltage regulators may be used for the LDO that are operable to adjust the power supply level of VccDCO via digital signals.

Figure 4C:
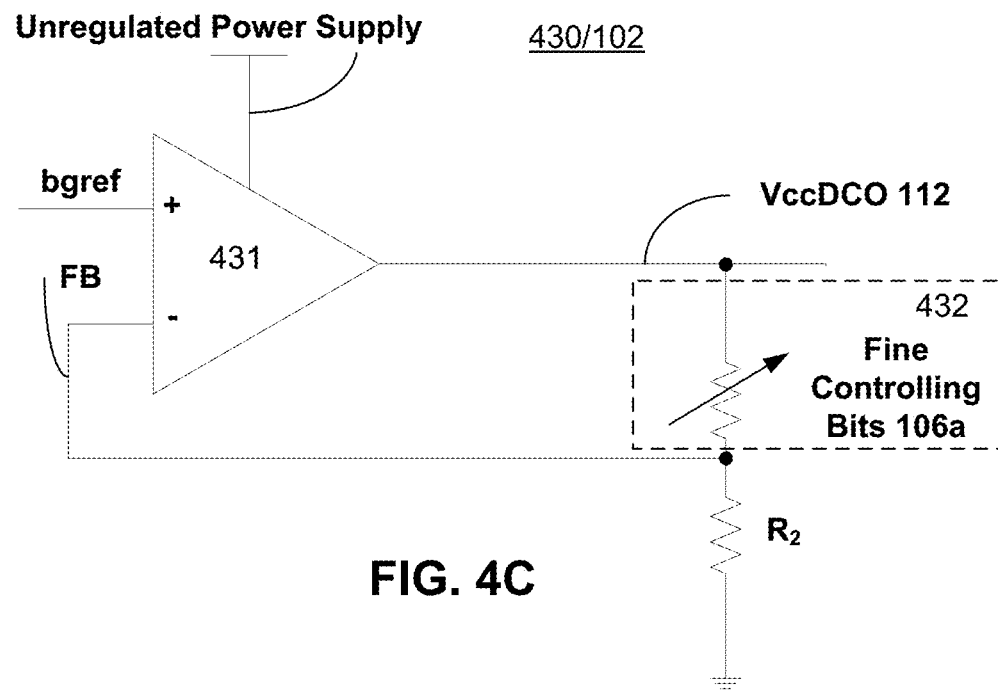
FIG. 4C is a Low Dropout Regulator (LDO) to generate an adjustable VccDCO, according to one embodiment of the disclosure.

FIG. 4C is an LDO 430/102 to generate an adjustable VccDCO 112, according to one embodiment of the disclosure. In one embodiment, the LDO 430/102 comprises an amplifier 431 which is operable to receive a reference voltage, bgref, and a feedback voltage FB. Any known amplifier may be used herein to perform the function of amplifier 431. In one embodiment, the amplifier 431 is powered by the unregulated power supply. In one embodiment, the reference voltage bgref is generated by a band-gap reference generator (not shown). In other embodiments, other types of reference generators may be used without changing the essence of the embodiments.

In one embodiment, the output of the amplifier 431 is VccDCO 112 while the FB signal is a divided version of VccDCO 112, divided by a resistor network. In one embodiment, the resistor network comprises a variable component 432 and a fixed resistive component $R_2$. In other embodiments, both components of the resistor network may comprise variable components 432. In one embodiment, the variable component 432 is coupled between VccDCO 112 and the node carrying the FB signal and the resistor $R_2$. In such an embodiment, one terminal of $R_2$ coupled to the variable component 432 while the other terminal of $R_2$ is coupled to ground. In another embodiment, the resistor $R_2$ is coupled between VccDCO 112 and the node carrying the FB signal, while one terminal of the variable component 432 is coupled to the resistor $R_2$ while the other terminal of the variable component 432 is coupled to ground. In the embodiments discussed herein, the variable component 432 has variable resistance controllable/adjustable by the fine code 106a.

Figure 4D:
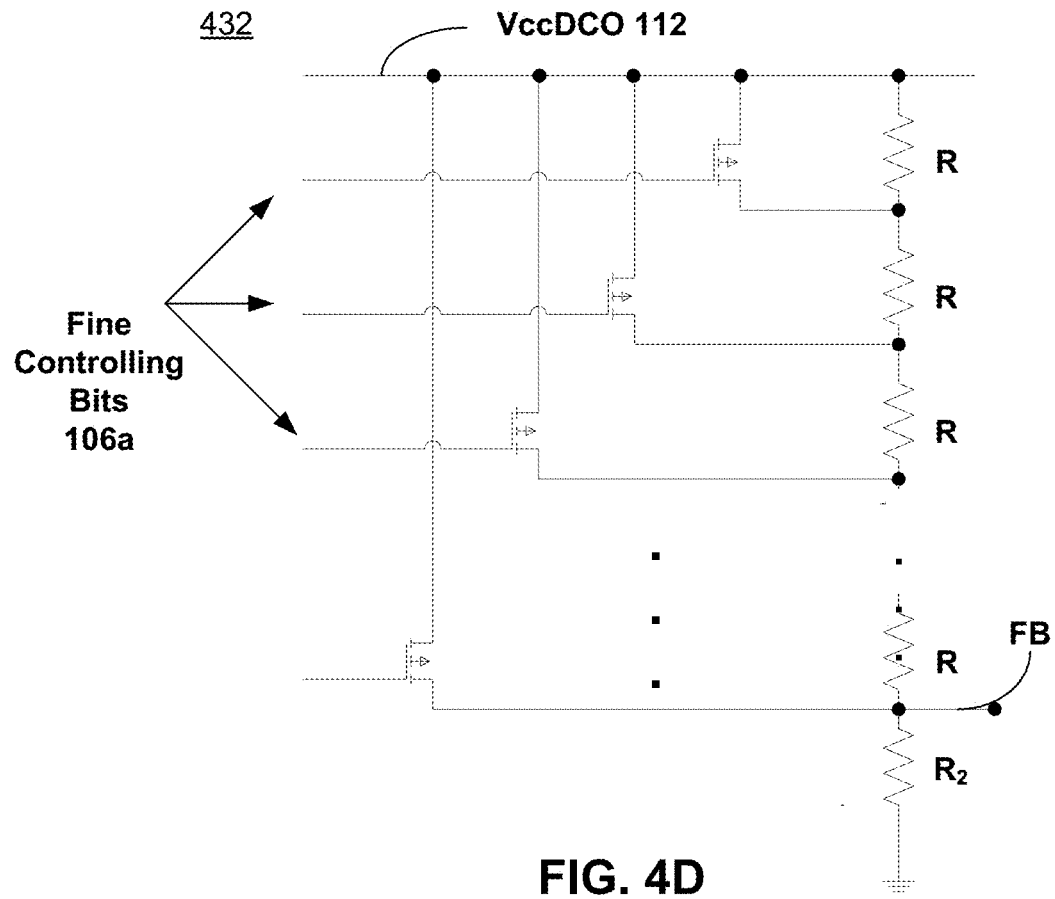
FIG. 4D is a variable resistive component of the LDO to generate the adjustable VccDCO, according to one embodiment of the disclosure.

FIG. 4D is the variable resistive component 432 of the LDO 430/102 to generate the adjustable VccDCO 112, according to one embodiment of the disclosure. In one embodiment, the fine control code 106a turn on/off the transistors with source/drain terminals coupled between the node carrying VccDCO 112 and internal nodes of a resistor ladder of resistors R. By turning on/off the transistors of the variable resistive component 432, the voltage level of the FB signal changes which changes the level of VccDCO 112.

As discussed herein, the output VccDCO 112 of the LDO 430/102 is a function of the variable resistive component 432. In one embodiment, when the resistance of the variable resistive component 432 increases, the voltage level of VccDCO 112 increases.

In one embodiment, the LDO 102 is operable to generate VccDCO 112 with a voltage range from 0.8V to 1.15V with a step of 6 mV per bit of the filtered fine code 106a. By varying VccDCO 112, the LDO 102 tunes the oscillation frequency of the DCO 113 and provides a resolution, e.g. 15 MHz frequency change in the DCO for every 6 mV voltage step. In other embodiments, the LDO 102 may be designed to provide a finer or coarser voltage step per bit of the filtered fine code 106a.

Referring back to FIG. 1, in one embodiment the ADPLL 101 comprises the DCO 113 with variable oscillating frequency. In the embodiments discussed herein, the oscillation frequency of the DCO 113 is adjusted by the thermometer coded coarse code 111, VccDCO 112 (via the filtered fine code 106a), and the thermometer coded ultra-fine code 110 until the ADPLL 101 acquires lock. In other embodiments, oscillation frequency of the DCO 113 may be adjusted by other formats of coarse, fine, and ultra-fine codes i.e., not necessarily thermometer encoded code words.

In one embodiment, the ADPLL 101 comprises a frequency divider 118 to divide the frequency of the DCO clock signal 114 to match (i.e., equate) the frequency of the reference clock signal. The output signal 119 of the divider 118 is then compared with the reference clock signal by the phase detector 103. Any known divider 118 can be configured to as frequency divider.

In one embodiment, the ADPLL 101 comprises a frequency comparator 116. In one embodiment, the frequency comparator 116 compares the frequency of the DCO signal 114 with a division ratio 'N' 115 (where 'N' is an integer) and generates a signal 117 indicating whether the oscillating frequency of the DCO 113 should be increased or slowed down. In one embodiment, the controller 105 receives the signal 117 and determines whether to increase or decrease the code values of the coarse (108), fine (106), and ultra-fine (107) codes. For example, the code value of the coarse code 108 is increased by one if the signal 117 indicates that the controller should increase the oscillating frequency of the DCO 113, and decreased by one if the signal 117 indicates that the controller should decrease the oscillating frequency of the DCO 113. In other embodiments, the code values may be increases or decreased by values greater than 1.

FIG. 4A is a frequency comparator 400/116 of the ADPLL 101, according to one embodiment of the disclosure. In one embodiment, the frequency comparator 400/116 comprises an enable generator 401 which is operable to generate a signal 403 with a period of integer multiple of the reference clock signal period. The Reset signal and the hndshk signal, which are inputs to the enable generator 401, are reset signals.

In one embodiment, the output 403 of the enable generator 401 is input to the metal-stability synchronizer 402 which synchronizes signals between the two different clock domains—reference clock domain and DCO clock domain—as shown by the dotted line separation.

In one embodiment, the frequency comparator 400/116 comprises a frequency counter 403 which is operable to count the DCO clock signal frequency. In one embodiment, the output of the frequency counter 403 is a code word signal 405 that indicates the count value. For example, when the output code word 405 from the frequency counter 400/116 is 10, it means that the DCO clock signal has a frequency 10 times faster than the frequency of the reference clock signal. In one embodiment, the counter is a 10 bit counter. Any known counter can be configured to be used as the frequency counter 403.

In one embodiment, the frequency comparator 400/116 comprises a sequential logic unit 404 (e.g., a latch or a flip-flop) which stores the value of the count of the DCO clock signal frequency relative to the reference clock period. Any known sequential logic unit can be configured to be used as the sequential logic unit 404.

In one embodiment, the frequency comparator 400/116 comprises a comparator 405 which is operable to compare the divided ratio of signal 115 (e.g., 4N) with the output 406 of the sequential logic unit 404. The output of the comparator 117 indicates whether the oscillating frequency of the DCO 113 should be increased or slowed down. As described herein, the controller 105 receives the signal 117 and determines whether to increase or decrease the code values of the coarse (108), fine (106), and ultra-fine (107) codes.

For example, the code value of the coarse code 108 is increased by one if the signal 117 indicates that the controller 105 should increase the oscillating frequency of the DCO 113. In one embodiment, the code value of the coarse code 108 is decreased by one if the signal 117 indicates that the controller 105 should decrease the oscillating frequency of the DCO 113. In other embodiments, the code values may be increased or decreased by values greater than 1.

Referring back to FIG. 1, the dotted regions 120 and 121 indicate the logic units and circuits that can be synthesized (design and layout) using hardware description languages (HDL) such as Verilog, VHDL, etc. and circuits that may need custom design and corresponding layout. In one embodiment, the logic units and circuits within the dotted region 120 are synthesized (design and layout) using HDL which results in faster design and verification compared to non-HDL synthesized logic units and circuits. In one embodiment, the circuits and logic units in the dotted region 121 are designed using non-HDL means i.e., using custom design and layout techniques.

Figure 2:
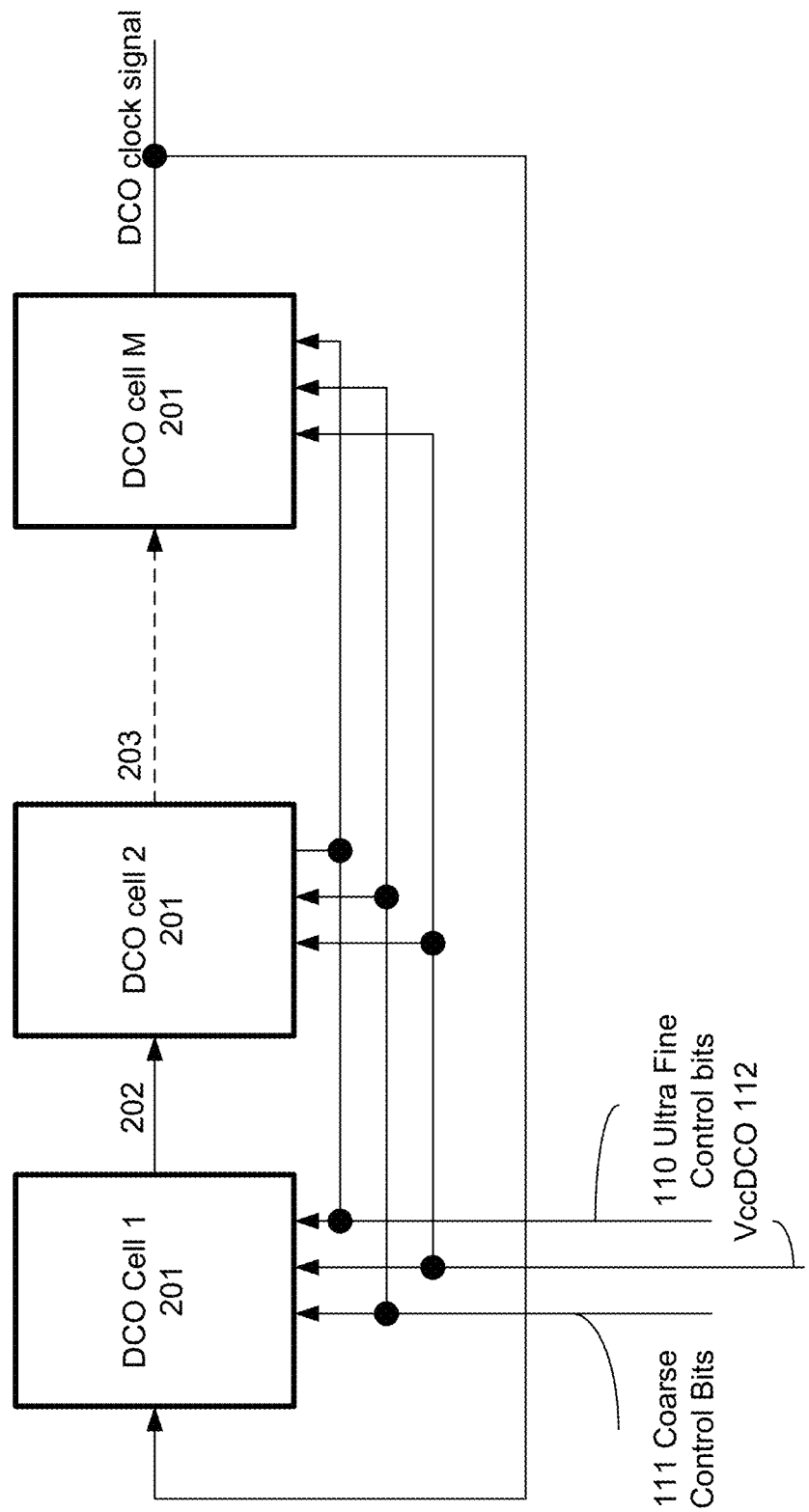
FIG. 2 is a block view of a digitally controlled oscillator (DCO) with adjustable delay, according to one embodiment of the disclosure.

FIG. 2 is a block view of the DCO 200/113 with adjustable delay, according to one embodiment of the disclosure. In one embodiment, the DCO 200/113 comprises a plurality of DCO delay cells 201 '1' through 'M', where 'M' is an integer. In one embodiment, 'M' is an odd number. In other embodiments, 'M' is an even number. The DCO delay cells 201 are serially coupled to one another forming a loop.

For example, output 201 of DCO cell 1 202 is received as input to DCO cell '2', and output 203 of DCO cell '2' is received by subsequent DCO cell, and output (DCO clock signal) of the last DCO cell 'M' is received as input by the first DCO cell '1' forming a feedback loop.

In one embodiment, each DCO cell 201 (cells '1' through 'M') receives VccDCO 112, thermometer encoded coarse code 111, and thermometer encoded ultra-fine code 110. In other embodiments, each DCO cell 201 (cells '1' through 'M') receives VccDCO 112, coarse code 108, and encoded ultra-fine code 107. In yet other embodiments, each DCO cell 201 may receive VccDCO 112, coarse code 108, and thermometer encoded ultra-fine code 110.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors (Bi-polar—PNP/NPN, BiC-MOS, CMOS, eFET, etc) may be used without departing from the scope of the disclosure. The transistors herein are p-type and n-type transistors, where the terms "MN" indicates an n-type transistor and "MP" indicates a p-type transistor.

Figure 3:
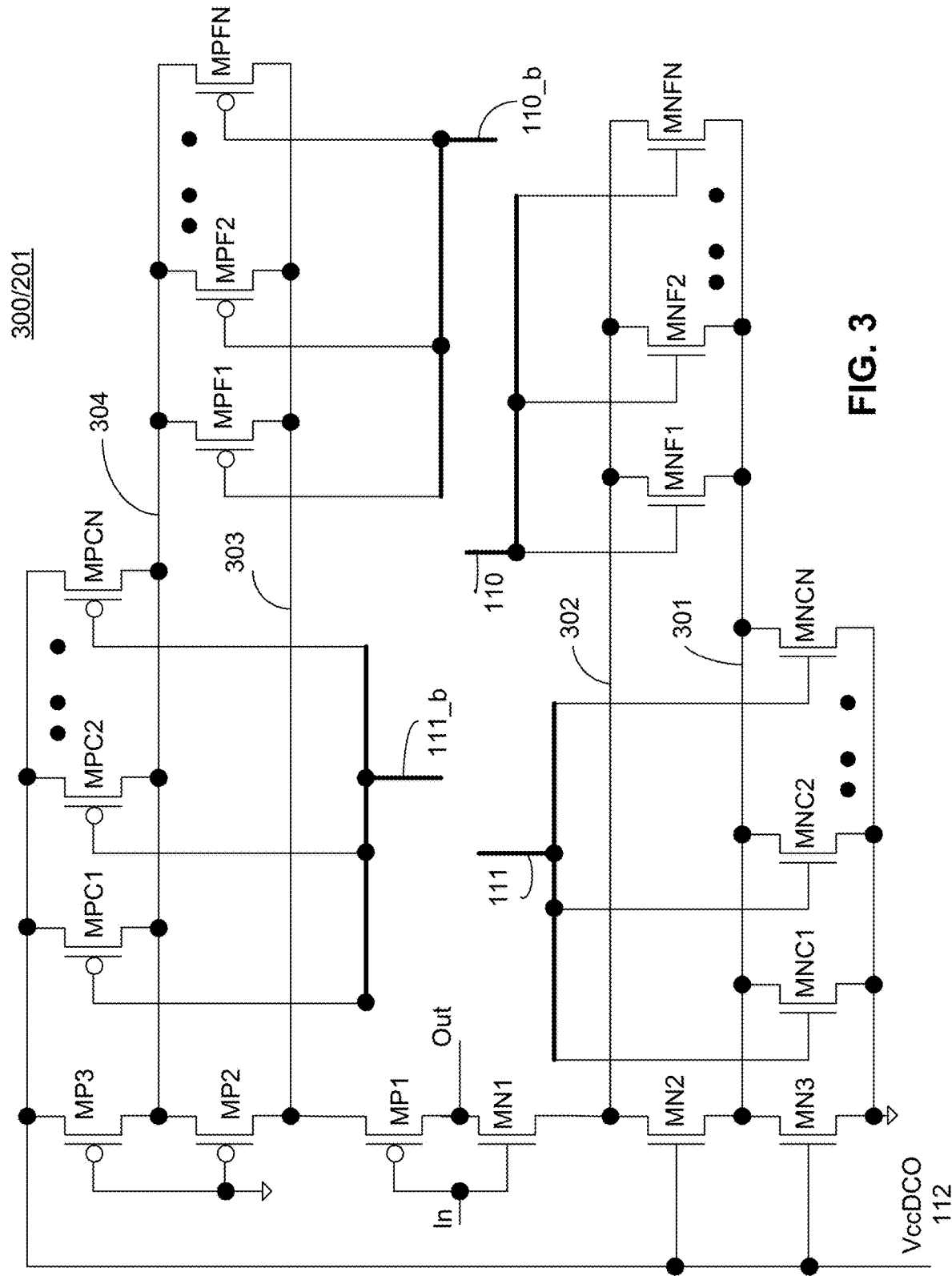
FIG. 3 is a schematic view of a cell of the DCO, according to one embodiment of the disclosure.

FIG. 3 is a schematic view of a cell of the DCO 300/201, according to one embodiment of the disclosure. In one embodiment, the DCO cell 300/201 comprises an inverter having transistors MP1 and MN1 which are configured so that the input signal "In" is inverted by the transistors and output as "Out."

In one embodiment, the drive strength of the inverter is controlled by p-type and n-type transistors coupled together as shown in the schematic. In one embodiment, transistor MN2 (also called first n-type device) is coupled in series with the n-type transistor MN1 of the inverter. In one embodiment, the gate terminal of MN1 is coupled to VccDCO 112. In one embodiment, transistor MN3 is coupled in series with MN2 such that the drain terminal of MN3 is coupled to the source terminal of MN2 while the source terminal of MN3 is coupled to ground. In one embodiment, the gate terminal of MN3 is coupled to VccDCO 112. By coupling the gate terminals of MN2 and MN3 to VccDCO 112, the drive strength of the inverter (MP1/MN1) is made adjustable by the power supply level of VccDCO 112 which is controlled by the fine code 106.

In one embodiment, p-type transistor MP2 (also called first p-type device) is coupled in series with the p-type transistor MP1 of the inverter. In one embodiment, the gate terminal of MP2 is coupled to ground. In one embodiment, transistor MP3 is coupled in series with MP2 such that the drain terminal of MP3 is coupled to the source terminal of MP2 while the source terminal of MP3 is coupled to VccDCO 112. In one embodiment, the gate terminal of MP3 is coupled to ground. By coupling the source terminal MP3 to VccDCO 112, the drive strength of the inverter (MP1/MN1) is made adjustable by the power supply level of VccDCO 112 which is controlled by the fine code 106.

In one embodiment, n-type transistors MNF1, MNF2 to MNFN are coupled in parallel to transistor MN2 such that the source and drain terminals of MNF1, MNF2 to MNFN are coupled to the source and drain terminals of MN2, where 'N' in the suffix of MNFN is an integer greater than '2.' In one embodiment, the gate terminals of MNF1, MNF2 to MNFN are coupled to bits of the ultra-fine code bus 110, such that the gate terminal of MNF1 is coupled to the least significant bit (LSB) of the ultra-fine bus 110, gate terminal of MNF2 is coupled to the bit immediately next to the LSB of the ultra-fine bus 110, and gate terminal of MNFN is coupled to the most significant bit (MSB) of the ultra-fine bus 110.

In one embodiment, the sizes (width/length—W/L) of the transistors MNF1, MNF2 to MNFN are the same. In other embodiments, the sizes MNF1, MNF2 to MNFN are thermometer weighted. In yet other embodiments, the sizes MNF1, MNF2 to MNFN are binary weighted. As each transistor from among the transistors MNF1, MNF2 to MNFN is turned on, the drive strength of MN2 is increased which allows the inverter (MP1/MN1) to operate faster i.e., stronger drive strength. Likewise, as each transistor from among the transistors MNF1, MNF2 to MNFN is turned off, the drive strength of MN2 is decreased which allows the inverter (MP1/MN1) to operate slower i.e., weaker drive strength.

In one embodiment, p-type transistors MPF1, MPF2 to MPFN are coupled in parallel to transistor MP2 such that the source and drain terminals of MPF1, MPF2 to MPFN are coupled to the source and drain terminals of MP2, where 'N' in the suffix of MPFN is an integer greater than '2.' In one embodiment, the gate terminals of MPF1, MPF2 to MPFN are coupled to bits of the inverted ultra-fine code bus 110_b (inverted version of ultra-fine code bus 110), such that the gate terminal of MPF1 is coupled to the LSB of the inverted ultra-fine bus 110_b, gate terminal of MPF2 is coupled to the bit immediately next to the LSB of the inverted ultra-fine bus 110_b, and gate terminal of MPFN is coupled to the MSB of the inverted ultra-fine bus 110_b.

In one embodiment, the sizes (width/length—W/L) of the transistors MPF1, MPF2 to MPFN are the same. In other embodiments, the sizes MPF1, MPF2 to MPFN are thermometer weighted. In yet other embodiments, the sizes MPF1, MPF2 to MPFN are binary weighted. As each transistor from among the transistors MPF1, MPF2 to MPFN is turned on, the drive strength of MP2 is increased which allows the inverter (MP1/MN1) to operate faster i.e., stronger drive strength. Likewise, as each transistor from among the transistors MPF1, MPF2 to MPFN is turned off, the drive strength of MP2 is decreased which allows the inverter (MP1/MN1) to operate slower i.e., weaker drive strength.

In one embodiment, n-type transistors MNC1, MNC2 to MNCN are coupled in parallel to transistor MN3 such that the source and drain terminals of MNC1, MNC2 to MNCN are coupled to the source and drain terminals of MN3, where 'N' in the suffix of MNCN is an integer greater than '2,' and where the source terminals are coupled to ground. In one embodiment, the gate terminals of MNC1, MNC2 to MNCN are coupled to bits of the coarse code bus 111, such that the gate terminal of MNC1 is coupled to the LSB of the coarse code bus 111, gate terminal of MNC2 is coupled to the bit immediately next to the LSB of the coarse code bus 111, and gate terminal of MNCN is coupled to the MSB of the coarse code bus 111.

In one embodiment, the sizes (width/length—W/L) of the transistors MNC1, MNC2 to MNCN are the same. In other embodiments, the sizes MNC1, MNC2 to MNCN are thermometer weighted. In yet other embodiments, the sizes MNC1, MNC2 to MNCN are binary weighted. As each transistor from among the transistors MNC1, MNC2 to MNCN is turned on, the drive strength of MN3 is increased which allows the inverter (MP1/MN1) to operate faster i.e., stronger drive strength. Likewise, as each transistor from among the transistors MNC1, MNC2 to MNCN is turned off, the drive strength of MN3 is decreased which allows the inverter (MP1/MN1) to operate slower i.e., weaker drive strength.

In one embodiment, p-type transistors MPC1, MPC2 to MPCN are coupled in parallel to transistor MP3 such that the source and drain terminals of MPC1, MPC2 to MPCN are coupled to the source and drain terminals of MP3, where 'N' in the suffix of MPCN is an integer greater than 2, and where the source terminals are coupled to VccDCO 112. In one embodiment, the gate terminals of MPC1, MPC2 to MPCN are coupled to bits of the inverted coarse code bus 111_b (inverted version of coarse code bus 111), such that the gate terminal of MPC1 is coupled to the LSB of the inverted coarse code bus 111_b, gate terminal of MPC2 is coupled to the bit immediately next to the LSB of the inverted coarse code bus 111, and gate terminal of MPCN is coupled to the MSB of the inverted coarse code bus 111_b.

In one embodiment, the sizes (width/length—W/L) of the transistors MPC1, MPC2 to MPCN are the same. In other embodiments, the sizes MPC1, MPC2 to MPCN are thermometer weighted. In yet other embodiments, the sizes MPC1, MPC2 to MPCN are binary weighted. As each transistor from among the transistors MPC1, MPC2 to MPCN is turned on, the drive strength of MP3 is increased which allows the inverter (MP1/MN1) to operate faster i.e., stronger drive strength. Likewise, as each transistor from among the transistors MPC1, MPC2 to MPCN is turned off, the drive strength of MP3 is decreased which allows the inverter (MP1/MN1) to operate slower i.e., weaker drive strength.

In one embodiment, as the supply level of VccDCO 112 is increased by adjusting the fine code 106, the drive strength of MP3, MPC1, and MPC2 to MPCN increases which in turn increases the drive strength of inverter (MP1/MN1) i.e., the inverter MP1/MN1 becomes faster (lesser propagation delay through the inverter).

Figure 6A:
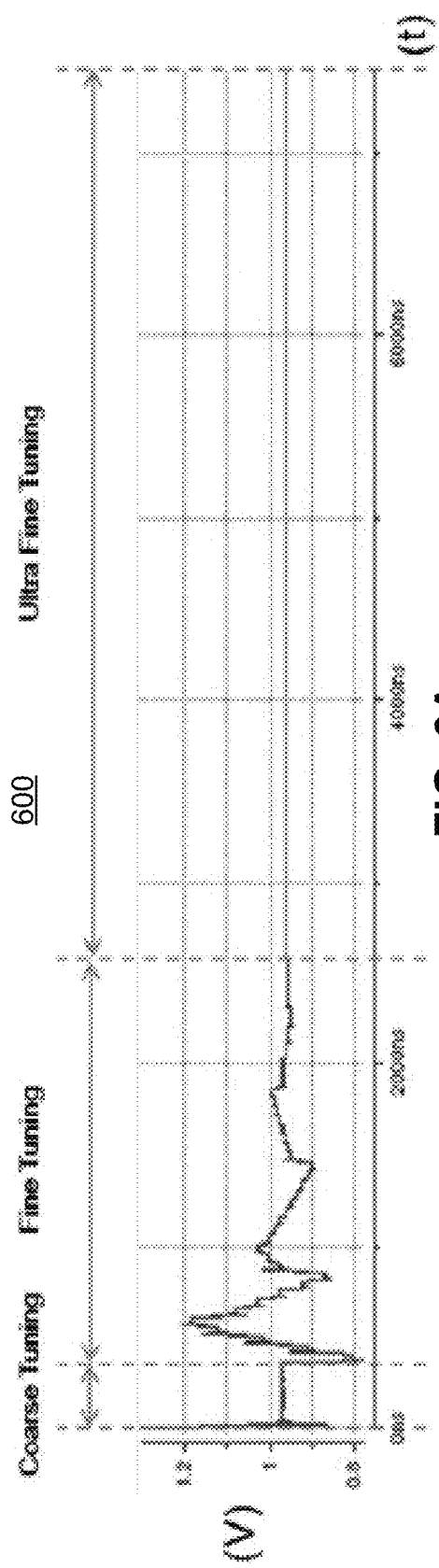
FIG. 6A is a plot showing output of the LDO during coarse, fine, and ultra-fine tuning of the DCO, according to one embodiment.

FIG. 6A is a plot 600 showing output 112 of the LDO 102 during coarse, fine, and ultra-fine tuning of the DCO 113, according to one embodiment. The ADPLL 101 begins with coarse tuning using coarse code 108 followed by fine tuning using fine code 106, and then by ultra-fine tuning using the ultra-fine code 107.

Figure 6B:
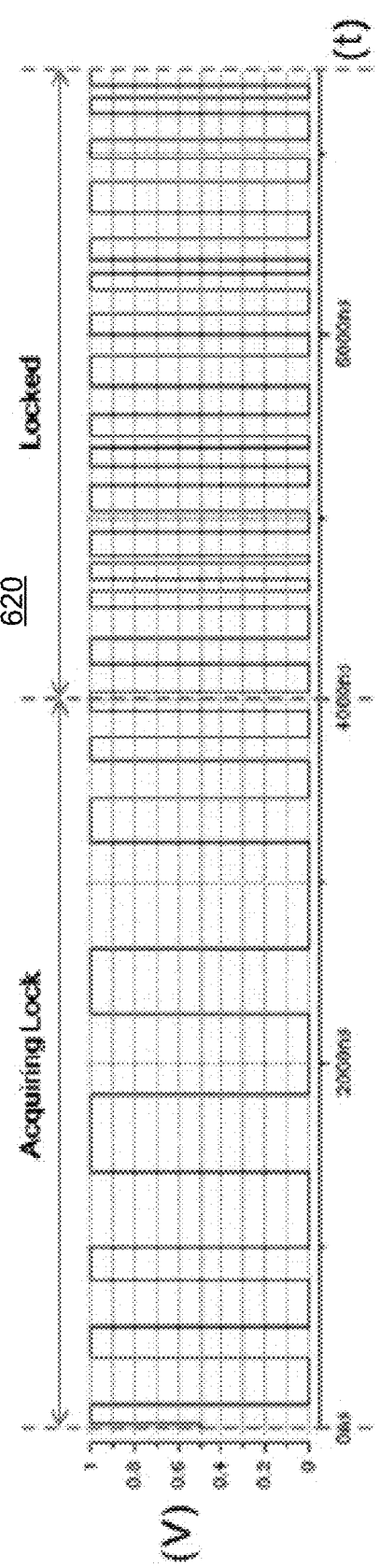
FIG. 6B is a plot, corresponding to plot of FIG. 6A, showing output of the phase detector during coarse, fine, and ultra-fine tuning of the DCO, according to one embodiment.

FIG. 6B is a plot 620, corresponding to plot 600, showing output 104 of the phase detector 103 during coarse, fine, and ultra-fine tuning of the DCO 113, according to one embodiment. During coarse tuning coarse code 108 is applied. After coarse tuning, fine tuning is applied using fine code 106 by adjusting the voltage level of VccDCO 112. During ultra-fine tuning using the ultra-fine code 107 that leads to locking of the ADPLL 101.

Figure 6C:
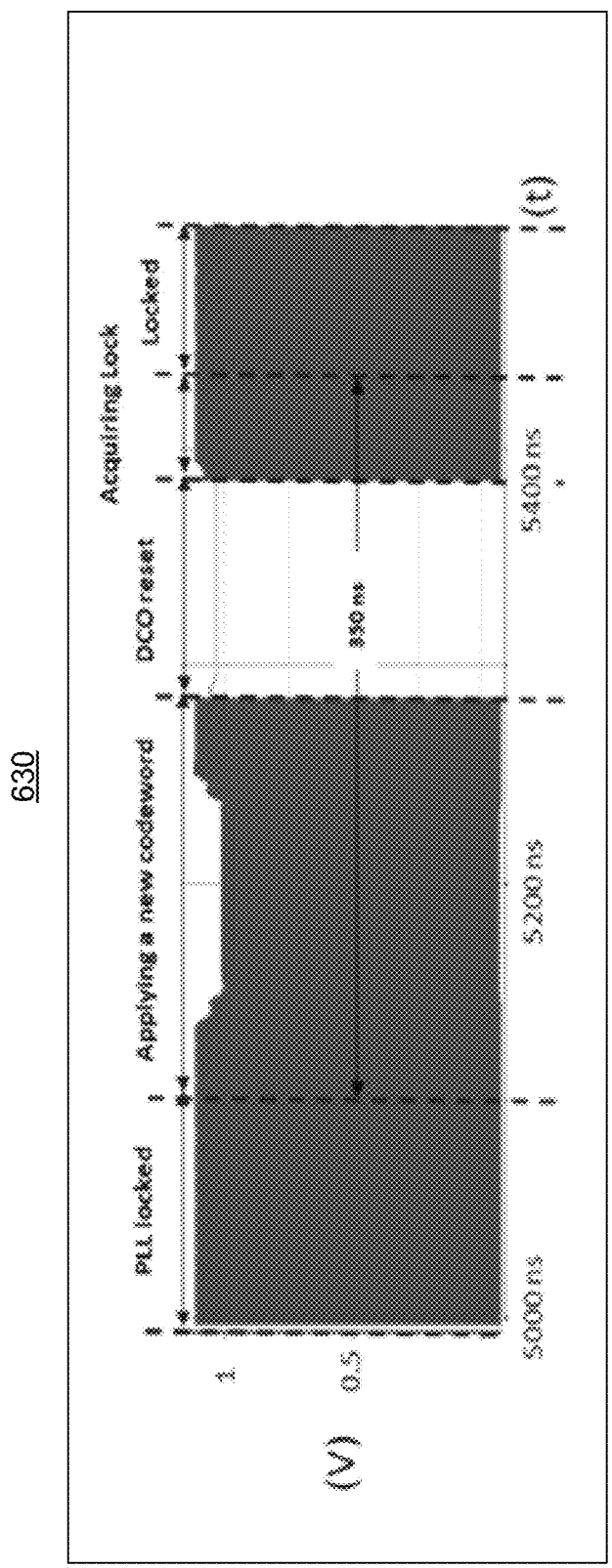
FIG. 6C is a plot showing output of the DCO to illustrate fast lock after reset is achieved by the ADPLL and after initial first lock using stored coarse, fine, and ultra-fine code words from the lock-up table, according to one embodiment.

FIG. 6C is a plot 630 showing output of the DCO 113 (i.e., DCO clock signal) to illustrate fast lock after reset is achieved by the ADPLL 101 and after initial first lock using stored coarse, fine, and ultra-fine code words (108, 106, and 107) from the look-up table, according to one embodiment.

Figure 7:
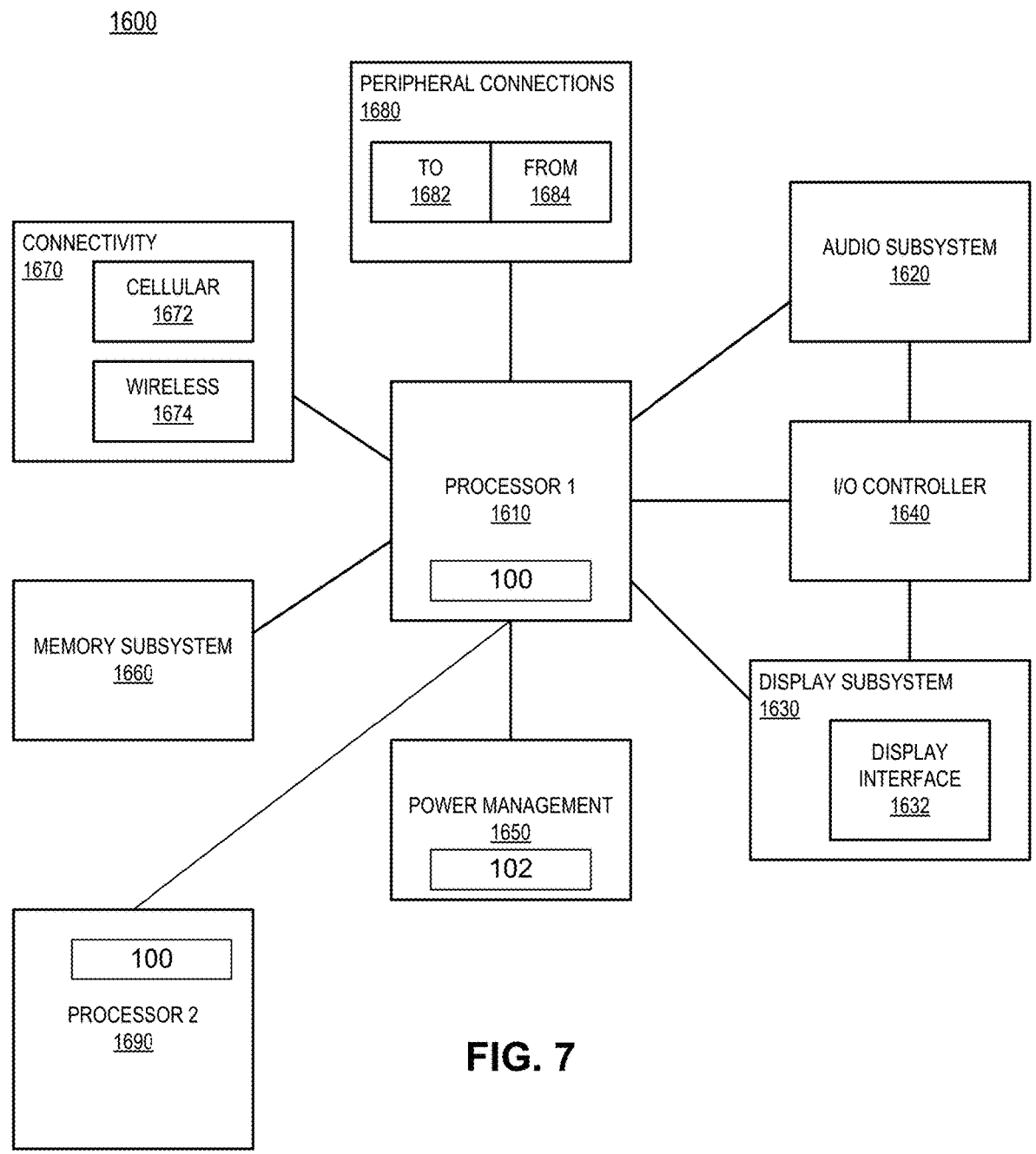
FIG. 7 is a system-level diagram of a smart device comprising a processor with the ADPLL, according to one embodiment of the disclosure.

FIG. 7 is a system-level diagram of a smart device 1600 comprising a processor with the circuit 100 i.e., ADPLL 101 and the LDO 102, according to one embodiment of the disclosure. FIG. 7 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

In one embodiment, the computing device 1600 includes a first processor 1610 with the circuit 100 and a second processor 1690 with the circuit 100, according to the embodiments discussed herein.

The various embodiments of the present disclosure may also comprise a network interface within 1670 such as a wireless interface so that a system embodiment may be incorporated into a wireless device such as cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of or in addition to display output. In another example, when display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the disclosure has been described in conjunction with specific embodiments thereof, many alternatives, modifications and variations of such embodiments will be apparent to those of ordinary skill in the art in light of the foregoing description. For example, instead of coupling the gate terminals of MP2 and MP3 to ground, the gate terminals of MP2 and MP3 can be coupled to VssDCO, which is an adjusted level of ground signal controllable by fine code 106 just like VccDCO is controlled by fine code.

The embodiments of the disclosure are intended to embrace all such alternatives, modifications, and variations as to fall within the broad scope of the appended claims. In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

The invention claimed is:

1. An apparatus comprising:
a digitally controlled oscillator (DCO);
a supply node to provide a regulated power supply to the DCO through a variable resistor; and
a digital loop filter (DLF) coupled to the DCO to generate a digital code according to a phase error, wherein the digital code is to adjust resistance of the variable resistor to modify the regulated power supply.

2. The apparatus of claim 1 comprises a circuit to receive the digital code and to generate a control signal according to the digital code.

3. The apparatus of claim 1 comprises a phase detector to detect the phase error between a reference signal and a feedback signal.

4. The apparatus of claim 3, wherein the phase detector is to provide the phase error indicating a phase lead condition or a phase lag condition.

5. The apparatus of claim 3 comprises a divider to receive an output of the DCO and to provide the feedback signal.

6. The apparatus of claim 1, wherein the DCO comprises an odd number of delay cells.

7. The apparatus of claim 6, wherein at least one of the delay cells is an inverter.

8. The apparatus of claim 1, wherein the DCO comprises an even number of delay cells.

9. The apparatus of claim 8, wherein at least one of the delay cells is an inverter.

10. The apparatus of claim 1, wherein the DCO comprises delay cells coupled together in a cyclic manner.

11. The apparatus of claim 1, wherein at least one circuit coupled to the DCO receives a power supply separate from the regulated power supply.

12. An apparatus comprising:
a digitally controlled oscillator (DCO);
a supply node to provide a regulated power supply to the DCO through a variable resistor; and
a digital loop filter (DLF) coupled to the DCO to generate a digital code according to a phase error, wherein the variable resistor has a resistance which is adjustable according to the digital code to modify the regulated power supply.

13. The apparatus of claim 12 comprises a circuit to receive the digital code and to generate a control signal according to the digital code.

14. The apparatus of claim 12, wherein at least one circuit coupled to the DCO receives a power supply separate from the regulated power supply.

15. A system comprising:
a memory;
a processor coupled to the memory, the processor comprising:

a digitally controlled oscillator (DCO);

a supply node to provide a regulated power supply to the DCO through a variable resistor; and a digital loop filter (DLF) coupled to the DCO to generate a digital code according to a phase error, wherein the digital code is to adjust resistance of the variable resistor to modify the regulated power supply; and a wireless interface to allow the processor to couple to another device.

16. The system of claim 15, wherein processor comprises a circuit to receive the digital code and to generate a control signal according to the digital code.

17. A method comprising:

providing a regulated power supply to a digitally controlled oscillator (DCO) through a variable resistor; and generating a digital code according to a phase error, wherein the variable resistor has a resistance which is adjustable according to the digital code to modify the regulated power supply.

18. The method of claim 17 comprises:

receiving the digital code and generating a control signal according to the digital code.

19. The method of claim 17 detecting the phase error between a reference signal and a feedback signal.

* * * * *